(12) United States Patent
Lin

(10) Patent No.: US 11,522,540 B2
(45) Date of Patent: Dec. 6, 2022

(54) GATE-DRIVING CIRCUIT AND DEVICE

(71) Applicant: DEVICE DYNAMICS LAB CO., LTD., Hsinchu County (TW)

(72) Inventor: Ming-Cheng Lin, Zhubei (TW)

(73) Assignee: Device Dynamics Lab Co., Ltd., Zhubei (TW)

( * ) Notice: Subject to any disclaimer, the term of this patent is extended or adjusted under 35 U.S.C. 154(b) by 0 days.

(21) Appl. No.: 17/509,698

(22) Filed: Oct. 25, 2021

(65) Prior Publication Data
US 2022/0224329 A1 Jul. 14, 2022

(30) Foreign Application Priority Data

Jan. 12, 2021 (TW) ................................ 110101135

(51) Int. Cl.
*H03K 3/00* (2006.01)
*H03K 17/16* (2006.01)
*H03K 17/687* (2006.01)
*G01R 31/26* (2020.01)

(52) U.S. Cl.
CPC ....... *H03K 17/687* (2013.01); *G01R 31/2607* (2013.01)

(58) Field of Classification Search
None
See application file for complete search history.

(56) References Cited

U.S. PATENT DOCUMENTS

| | | | | | |
|---|---|---|---|---|---|
| 3,809,998 | A | * | 5/1974 | Mansson | H02M 3/04 327/332 |
| 4,831,280 | A | * | 5/1989 | Caya | H03K 17/6872 327/179 |
| 5,686,820 | A | * | 11/1997 | Riggio, Jr. | G05F 1/575 323/280 |
| 8,395,422 | B2 | * | 3/2013 | Ogawa | H03K 17/063 327/109 |
| 8,558,587 | B2 | * | 10/2013 | Machida | H02M 1/08 327/427 |
| 9,755,639 | B2 | * | 9/2017 | Kampl | H03K 17/74 |
| 10,263,538 | B2 | * | 4/2019 | Ikeda | H02M 7/537 |
| 10,432,081 | B2 | * | 10/2019 | Hirose | H02M 3/33592 |
| 10,826,484 | B2 | * | 11/2020 | Hu | H03K 17/04106 |
| 11,165,421 | B1 | * | 11/2021 | Nosaka | H02M 1/08 |

* cited by examiner

*Primary Examiner* — Kenneth B Wells
(74) *Attorney, Agent, or Firm* — Michael Best & Friedrich LLP

(57) ABSTRACT

A gate-driving circuit includes a unidirectional module and two driving modules, and has a low-potential terminal, an output terminal, and two input terminals via which two driving signals are received. Each of the driving modules includes a capacitor and a resistor that are connected in parallel and between the output terminal and the respective one of input terminals, a power source that is connected between the output terminal and the low-potential terminal, and a diode that is connected between the output terminal and the power source. The unidirectional module is connected between the output terminal and one of the driving modules, and allows an electrical signal to pass only from the one of the driving modules to the output terminal.

15 Claims, 2 Drawing Sheets

GATE-DRIVING CIRCUIT AND DEVICE

CROSS-REFERENCE TO RELATED APPLICATION

This application claims priority of Taiwanese Invention Patent Application No. 110101135, filed on Jan. 12, 2021.

FIELD

The disclosure relates to agate-driving circuit and a gate-driving device for outputting a gate-driving signal to a gate of a device under test (DUT) to measure characteristics of the DUT.

BACKGROUND

Compared with a silicon-based semiconductor device (also known as a Si device), a device made of third-generation semiconductor materials, e.g., silicon carbide (SiC) or gallium nitride (GaN), has superior material properties such as high carrier mobility and wide band gap. Accordingly, a figure of merit (FOM) of a GaN device is five to ten times greater than that of the Si device, and thus the GaN device shows great potential for replacing the Si device in some applications, such as high voltage devices, high power devices, and devices for high-frequency communication.

At present, GaN devices have passed Joint Electron Device Engineering Council (JEDEC) reliability standards. Since a device made of the third-generation semiconductor materials may behave differently in static and dynamic conditions, a huge number of system-level field tests are required to ensure the reliability of GaN devices in dynamic conditions.

SUMMARY

Therefore, an object of the disclosure is to provide a gate-driving circuit and a gate-driving device that are for outputting a gate-driving signal to a gate of a device under test (DUT).

According to one aspect of the disclosure, the gate-driving circuit has a first circuit input terminal via which a first driving signal is received, a second circuit input terminal via which a second driving signal is received, a low-potential terminal, and a circuit output terminal via which the gate-driving signal is outputted. The gate-driving circuit includes a first driving module, a second driving module and a unidirectional module.

The first driving module has a module input terminal that is electrically connected to the first circuit input terminal of the gate-driving circuit, and a module output terminal that is electrically connected to the circuit output terminal of the gate-driving circuit. The first driving module includes an input capacitor, an input resistor, an adjustable power source and a first diode. The input capacitor and the input resistor are connected in parallel and are electrically connected between the module input terminal and the module output terminal of the first driving module. The adjustable power source is electrically connected between the module output terminal of the first driving module and the low-potential terminal of the gate-driving circuit. The first diode is electrically connected between the module output terminal of the first driving module and the adjustable power source of the first driving module.

The second driving module has a module input terminal that is electrically connected to the second circuit input terminal of the gate-driving circuit, and a module output terminal that is electrically connected to the circuit output terminal of the gate-driving circuit. The second driving module includes an input capacitor, an input resistor, an adjustable power source and a first diode. The input capacitor and the input resistor are connected in parallel and are electrically connected between the module input terminal and the module output terminal of the second driving module. The adjustable power source is electrically connected between the module output terminal of the second driving module and the low-potential terminal of the gate-driving circuit. The first diode is electrically connected between the module output terminal of the second driving module and the adjustable power source of the second driving module.

The unidirectional module is electrically connected between the module output terminal of the second driving module and the circuit output terminal of the gate-driving circuit, and is configured to allow an electrical signal to pass only from the second driving module to the circuit output terminal of the gate-driving circuit.

According to another aspect of the disclosure, the gate-driving device has a first device input terminal via which a first control signal is received, a second device input terminal via which a second control signal is received, a high-potential terminal, a low-potential terminal, and a device output terminal via which the gate-driving signal is outputted. The gate-driving device includes a first driver, a second driver and a gate-driving circuit.

The first driver is electrically connected to the first device input terminal, the high-potential terminal and the low-potential terminal. The first driver is configured to receive the first control signal from the first device input terminal, and to output a first driving signal based on the first control signal.

The second driver is electrically connected to the second device input terminal, the high-potential terminal and the low-potential terminal. The second driver is configured to receive the second control signal from the second device input terminal, and to output a second driving signal based on the second control signal.

The gate-driving circuit has a first circuit input terminal via which the first driving signal is received, a second circuit input terminal via which the second driving signal is received, and a circuit output terminal that is electrically connected to the device output terminal of the gate-driving device.

The gate-driving circuit includes a first driving module, a second driving module and a unidirectional module.

The first driving module has a module input terminal that is electrically connected to the first circuit input terminal of the gate-driving circuit, and a module output terminal that is electrically connected to the circuit output terminal of the gate-driving circuit. The first driving module includes an input capacitor, an input resistor, an adjustable power source and a first diode. The input capacitor and the input resistor are connected in parallel and are electrically connected between the module input terminal and the module output terminal of the first driving module. The adjustable power source is electrically connected between the module output terminal of the first driving module and the low-potential terminal of the gate-driving circuit. The first diode is electrically connected between the module output terminal of the first driving module and the adjustable power source of the first driving module.

The second driving module has a module input terminal that is electrically connected to the second circuit input terminal of the gate-driving circuit, and a module output terminal that is electrically connected to the circuit output terminal of the gate-driving circuit. The second driving module includes an input capacitor, an input resistor, an adjustable power source and a first diode. The input capacitor and the input resistor are connected in parallel and are electrically connected between the module input terminal and the module output terminal of the second driving module. The adjustable power source is electrically connected between the module output terminal of the second driving module and the low-potential terminal of the gate-driving circuit. The first diode is electrically connected between the module output terminal of the second driving module and the adjustable power source of the second driving module.

The unidirectional module is electrically connected between the module output terminal of the second driving module and the circuit output terminal of the gate-driving circuit, and is configured to allow an electrical signal to pass only from the second driving module to the circuit output terminal of the gate-driving circuit.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
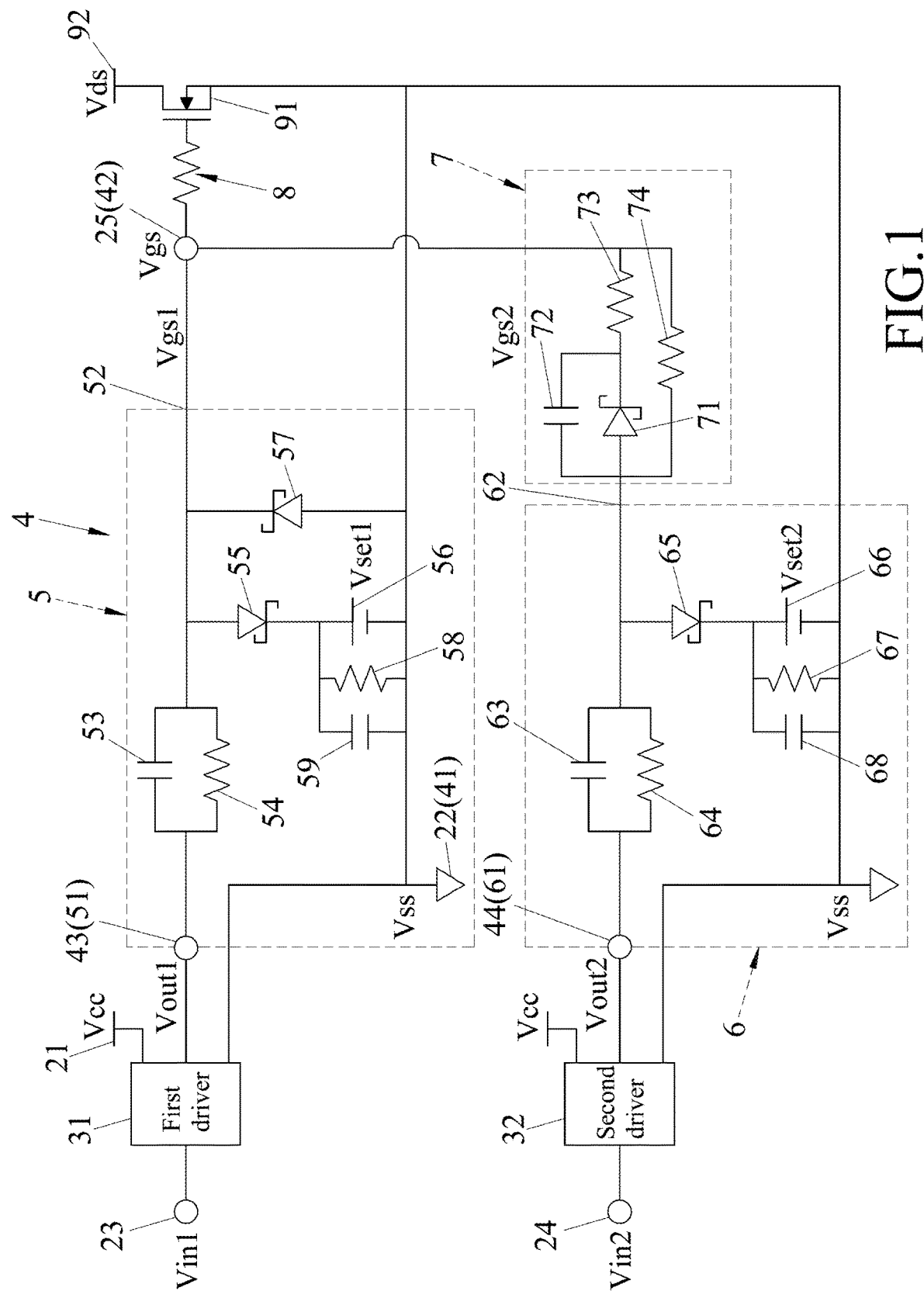
FIG. 1 is a circuit diagram illustrating an embodiment of a gate-driving device according to the disclosure.
Figure 2:
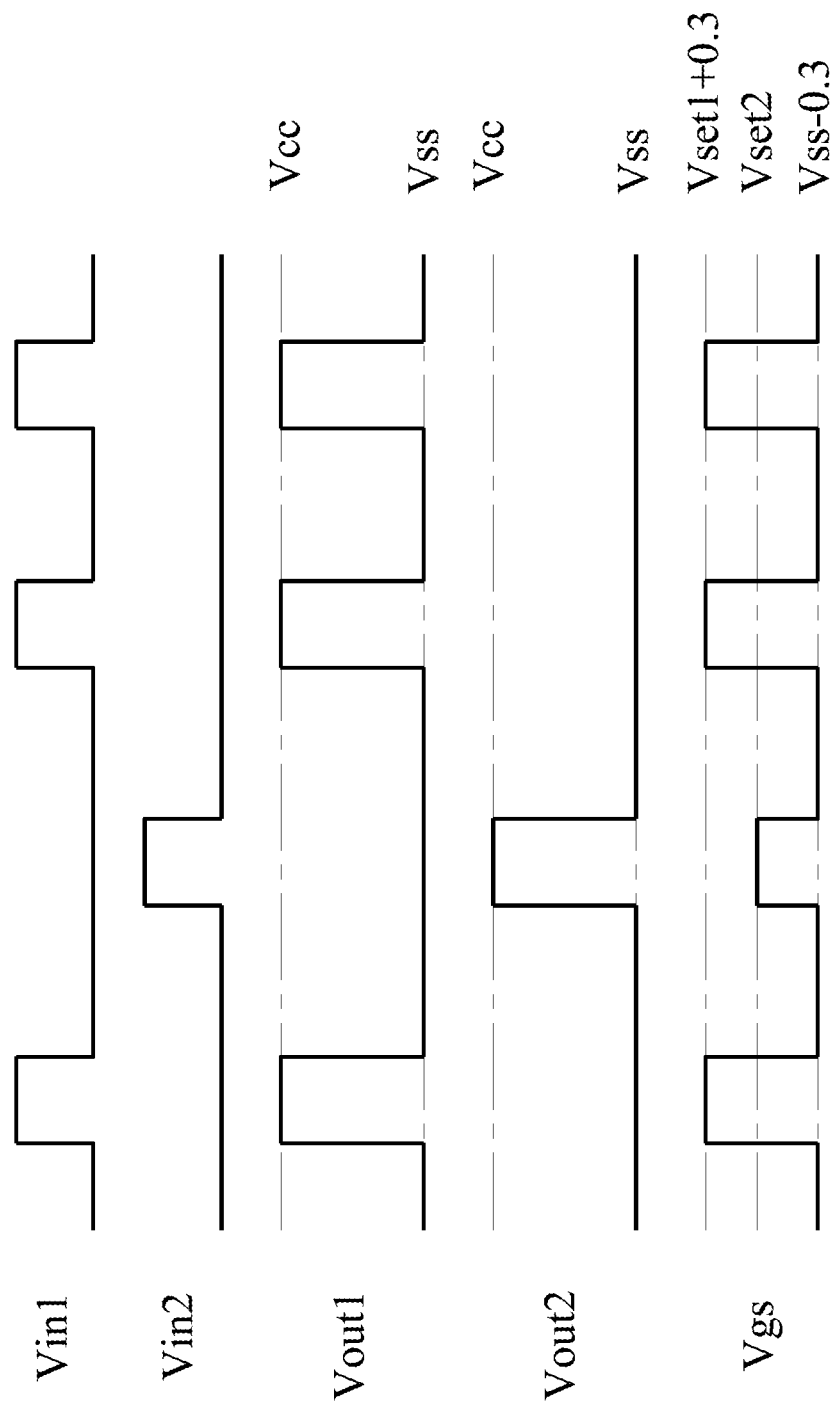
FIG. 2 is a timing diagram illustrating various signals used in the gate-driving device according to embodiments of the disclosure.

Referring to FIGS. 1 and 2, an embodiment of a gate-driving device for outputting a gate-driving signal (Vgs) to a gate of a device under test (DUT) 91 is illustrated. For example, the DUT 91 is a power device made of third-generation semiconductor materials, and is to be tested under assistance of the gate-driving device.

The gate-driving device has a first device input terminal 23 via which a first control signal (Vin1) is received, a second device input terminal 24 via which a second control signal (Vin2) is received, a high-potential terminal 21, a low-potential terminal 22, and a device output terminal 25 via which the gate-driving signal (Vgs) is outputted to the DUT 91.

In this embodiment, a high reference voltage (Vcc, e.g., 5V) is provided (e.g., by an external power supply) to the gate-driving device through the high-potential terminal 21, and the low-potential terminal 22 is connected to ground which has a ground voltage (0V) serving as a low reference voltage (Vss).

In this embodiment, the first control signal (Vin1) and the second control signal (Vin2) are generated and outputted by a control circuit (not shown). The first control signal (Vin1) and the second control signal (Vin2) are generated based on a pulse signal having a plurality of pulses. Specifically, the first control signal (Vial) is generated by masking one part of the pulses of the pulse signal, and the second control signal (Vin2) is generated by masking the other part of the pulses of the pulse signal. That is to say, the first control signal (Vin1) and the second control signal (Vin2) coopera-tively constitute a waveform of the complete pulse signal, and the pulses of the first control signal (Vin1) do not overlap the pulses of the second control signal (Vin2).

It is noted that, for a signal generated based on a pulse signal, a masked rate of N % of the signal means that the signal is generated by masking a number N of pulse(s) for every 100 pulses of the pulse signal. In a test for obtaining the dynamic threshold voltage of the DUT 91 under a normal switching operation, the first control signal (Vin1) may have a masked rate equal to or less than 1%, and the second control signal (Vin2) may have a masked rate equal to or more than 99%.

In this embodiment, the DUT 91 further has a terminal (e.g., the drain) electrically connected to the low-potential terminal 22 of the gate-driving device, and another terminal (e.g., the source) electrically connected to a to-be-tested terminal 92. The DUT 91 will output a to-be-tested voltage (Vds) at said another terminal, which is electrically connected to the to-be-tested terminal 92, based on the gate-driving signal (Vgs), and the to-be-tested voltage (Vds) is outputted via the to-be-tested terminal 92 to an application circuit or a characterization circuit (not shown) for further analysis. It is worth to note that the to-be-tested voltage (Vds) is related to intrinsic properties of the DUT 91.

The gate-driving device includes a first driver 31, a second driver 32, a gate-driving circuit 4 and a slew-rate-adjusting resistor 8.

The first driver 31 is electrically connected to the first device input terminal 23, the high-potential terminal 21 and the low-potential terminal 22 of the gate-driving device. The first driver 31 is configured to receive the first control signal (Vin1) from the first device input terminal 23, and to output a first driving signal (Vout1) based on the first control signal (Vin1).

The second driver 32 is electrically connected to the second device input terminal 24, the high-potential terminal 21 and the low-potential terminal 22 of the gate-driving device. The second driver 32 is configured to receive the second control signal (Vin2) from the second device input terminal 24, and to output a second driving signal (Vout2) based on the second control signal (Vin2).

In this embodiment, each of the first driver 31 and the second driver 32 is implemented by a gate driver, and is configured to buffer the corresponding one of the first control signal (Vin1) and the second control signal (Vin2) to generate the corresponding one of the first driving signal (Vout1) and the second driving signal (Vout2), enhancing combination of the first and second control signals (Vin1, Vin2). Specifically, the first driving signal (Vout1) thus generated has a phase corresponding to a phase of the first control signal (Vin1), and the second driving signal (Vout2) thus generated has a phase corresponding to a phase of the second control signal (Vin2).

The gate-driving circuit 4 has a first circuit input terminal 43 that is electrically connected to the first driver 31 to receive the first driving signal (Vout1), a second circuit input terminal 44 that is electrically connected to the second driver 32 to receive the second driving signal (Vout2), a low-potential terminal 41 that is electrically connected to the low-potential terminal 22 of the gate-driving device, and a circuit output terminal 42 that is electrically connected to the device output terminal 25 of the gate-driving device.

The gate-driving circuit 4 includes a first driving module 5, a second driving module 6 and a unidirectional module 7.

The first driving module 5 has a module input terminal 51 that is electrically connected to the first circuit input terminal 43 of the gate-driving circuit 4, and a module output terminal 52 that is electrically connected to the circuit output terminal 42 of the gate-driving circuit 4.

The first driving module 5 includes an input capacitor 53, an input resistor 54, a first diode 55, an adjustable power source 56, a second diode 57, a current bypass resistor 58 and a voltage-stabilizing capacitor 59. Each of the input capacitor 53 and the voltage-stabilizing capacitor 59 may be a commercially available capacitor (e.g., a multilayer ceramic capacitor, a ceramic disc capacitor, a multilayer polyester film capacitor, a tubular ceramic capacitor, a polystyrene capacitor, a metalized polyester film capacitor, an aluminum electrolytic capacitor, a plastic film capacitor, a film dielectric capacitor, a polymer film capacitor, etc.), and each of the input resistor 54 and the current bypass resistor 58 may be a commercially available resistor (e.g., an axial-lead resistor, a carbon pile resistor, a carbon composition resistor, a carbon film resistor, a printed carbon resistor, a thick film resistor, a metal film resistor, a metal-oxide film resistor, etc.).

The input capacitor 53 and the input resistor 54 are connected in parallel, and are electrically connected between the module input terminal 51 and the module output terminal 52 of the first driving module 5. That is to say, a parallel connection of the input capacitor 53 and the input resistor 54 has one end electrically connected to the module input terminal 51 to receive the first driving signal (Vout1), and the other end electrically connected to the module output terminal 52. The input capacitor 53 provides a path for the first driving signal (Vout1) that is in a transient state, and the input resistor 54 provides a path for the first driving signal (Vout1) that is in a static state.

The adjustable power source 56 is electrically connected between the module output terminal 52 of the first driving module 5 and the low-potential terminal 41 of the gate-driving circuit 4. The adjustable power source 56 has a positive electrode, and a negative electrode that is electrically connected to the low-potential terminal 41 of the gate-driving circuit 4. The adjustable power source 56 is implemented by a power supply, and is configured to output a first variable voltage (Vset1) that is adjustable.

The first diode 55 is electrically connected between the module output terminal 52 of the first driving module 5 and the positive electrode of the adjustable power source 56. Specifically, the first diode 55 has an anode electrically connected to the module output terminal 52, and a cathode electrically connected to the positive electrode of the adjustable power source 56.

The second diode 57 has an anode electrically connected to the low-potential terminal 41 of the gate-driving circuit 4, and a cathode electrically connected to the module output terminal 52 of the first driving module 5. The second diode 57 is used to set a voltage value of the gate-driving signal (Vgs) in logic low to be close to the low reference voltage (Vss) i.e., the ground voltage.

For example, each of the first diode 55 and the second diode 57 is implemented by a Schottky diode that has a fast switching action and a relatively low forward voltage drop.

The current bypass resistor 58 has two ends electrically connected to the positive electrode and the negative electrode of the adjustable power source 56, respectively. The current bypass resistor 58 is used to provide a bypass for electric current flowing through the first diode 55. The resistance of the current bypass resistor 58 affects an upper limit of a current value of the electric current flowing through the first diode 55.

The voltage-stabilizing capacitor 59 has two ends electrically connected to the positive electrode and the negative electrode of the adjustable power source 56, respectively. The voltage-stabilizing capacitor 59 is used to stabilize the voltage across the adjustable power source 56.

Similar to the first driving module 5, the second driving module 6 has a module input terminal 61 that is electrically connected to the second circuit input terminal 44 of the gate-driving circuit 4, and a module output terminal 62 that is electrically connected via the unidirectional module 7 to the circuit output terminal 42 of the gate-driving circuit 4.

The second driving module 6 includes an input capacitor 63, an input resistor 64, a diode 65, an adjustable power source 66, a current bypass resistor 67 and a voltage-stabilizing capacitor 68. Each of the input capacitor 63 and the voltage-stabilizing capacitor 68 may be a commercially available capacitor (e.g., a multilayer ceramic capacitor, a ceramic disc capacitor, a multilayer polyester film capacitor, a tubular ceramic capacitor, a polystyrene capacitor, a metalized polyester film capacitor, an aluminum electrolytic capacitor, a plastic film capacitor, a film dielectric capacitor, a polymer film capacitor, etc.), and each of the input resistor 64 and the current bypass resistor 67 may be a commercially available resistor (e.g., an axial-lead resistor, a carbon pile resistor, a carbon composition resistor, a carbon film resistor, a printed carbon resistor, a thick film resistor, a metal film resistor, a metal-oxide film resistor, etc.).

The input capacitor 63 and the input resistor 64 are connected in parallel and are electrically connected between the module input terminal 61 and the module output terminal 62 of the second driving module 6. That is to say, a parallel connection of the input capacitor 63 and the input resistor 64 has one end electrically connected to the module input terminal 61 to receive the second driving signal (Vout2), and the other end electrically connected to the module output terminal 62. The input capacitor 63 provides a path for the second driving signal (Vout2) that is in a transient state, and the input resistor 64 provides a path for the second driving signal (Vout2) that is in a static state.

The adjustable power source 66 is electrically connected between the module output terminal 62 of the second driving module 6 and the low-potential terminal 41 of the gate-driving circuit 4. The adjustable power source 66 has a positive electrode, and a negative electrode that is electrically connected to the low-potential terminal 41 of the gate-driving circuit 4. The adjustable power source 66 is implemented by a power supply, and is configured to output a second variable voltage (Vset2) that is adjustable.

The diode 65 is electrically connected between the module output terminal 62 of the second driving module 6 and the positive electrode of the adjustable power source 66. Specifically, the diode 65 has an anode electrically connected to the module output terminal of the second driving module 6, and a cathode electrically connected to the positive electrode of the adjustable power source 66. For example, the diode 65 is also implemented by a Schottky diode.

The current bypass resistor 67 has two ends electrically connected to the positive electrode and the negative electrode of the adjustable power source 66, respectively. The current bypass resistor 67 is used to provide a bypass for electric current flowing through the diode 65. The resistance of the current bypass resistor 67 affects an upper limit of a current value of the electric current flowing through the diode 65.

The voltage-stabilizing capacitor 68 has two ends electrically connected to the positive electrode and the negative electrode of the adjustable power source 66, respectively.

The voltage-stabilizing capacitor 68 is used to stabilize the voltage across the adjustable power source 66.

The unidirectional module 7 is electrically connected between the module output terminal 62 of the second driving module 6 and the circuit output terminal 42 of the gate-driving circuit 4. The unidirectional module 7 is configured to allow an electrical signal (e.g., a positive-voltage signal) to flow only from the second driving module 6 to the circuit output terminal 42 of the gate-driving circuit 4. Since the gate-driving circuit 4 is configured to operate in high frequency, the unidirectional module 7 is able to achieve the effect of allowing an electrical signal to flow only from the second driving module 6 to the circuit output terminal 42.

The unidirectional module 7 includes a diode 71, a capacitor 72, a variable resistor 73 and a resistor 74.

The diode 71 has an anode that is electrically connected to the module output terminal 62 of the second driving module 6, and a cathode that is electrically connected to the circuit output terminal 42 of the gate-driving circuit 4. For example, the diode 71 is also implemented by a Schottky diode.

The capacitor 72 is electrically connected to the diode 71 in parallel. In this embodiment, the capacitor is implemented by a general capacitor (e.g., a commercially available capacitor as exemplified above), and is used to allow a transient electrical signal to pass bidirectionally through the capacitor 72 and to block passage of a steady electrical signal.

The variable resistor 73 is electrically connected between the cathode of the diode 71 and the circuit output terminal 42 of the gate-driving circuit 4.

The resistor 74 is connected between the anode of the diode 71 and the circuit output terminal 42 of the gate-driving circuit 4. In this embodiment, the resistor 74 is implemented to be a general resistor (e.g., a commercially available resistor as exemplified above), and is used to allow a steady electrical signal to pass bidirectionally through the resistor 74.

The slew-rate-adjusting resistor 8 has one end electrically connected to the device output terminal of the gate-driving device, and the other end electrically connected to the gate of the DUT 91. The resistance of the slew-rate-adjusting resistor 8 affects the slew rate (i.e., the switching speed) of the DUT 91. For example, the slew-rate-adjusting resistor 8 is a commercially available resistor as exemplified above.

An example of using the gate-driving device according to the disclosure is described below for explaining operations of the gate-driving device.

The first control signal (Vin1) and the second control signal (Vin2) are respectively fed into the first driver 31 and the second driver 32. Then, the first driver 31 outputs the first driving signal (Vout1) based on the first control signal (Vin1), and the second driver 32 outputs the second driving signal (Vout2) based on the second control signal (Vin2). It is worth to note that, for each of the first driving signal (Vout1) and the second driving signal (Vout2), a logic high thereof approximates to the high reference voltage (Vcc), and a logic low thereof approximates to the low reference voltage (Vss). In addition, the high reference voltage (Vcc) is greater than the first variable voltage (Vset1); the first variable voltage (Vset1) is greater than the second variable voltage (Vset2); and the second variable voltage (Vset2) is greater than the low reference voltage (Vss).

Next, the first driving signal (Vout1) is transmitted to and processed by the first driving module 5 so as to output a first processed signal (Vgs1) at the device output terminal 25, and the second driving signal (Vout2) is transmitted to and processed by the second driving module 6 and the unidirectional module 7 so as to output a second processed signal (Vgs2) also at the device output terminal 25. The first processed signal (Vgs1) and the second processed signal (Vgs2) are combined to form the gate-driving signal (Vgs) that is outputted via the device output terminal 25 to the DUT 91 through the slew-rate-adjusting resistor 8.

Referring to FIGS. 1 and 2, in a scenario where the first driving signal (Vout1) is logic high (i.e., having a voltage value of the reference high voltage (Vcc)) and the second driving signal (Vout2) is logic low (i.e., having a voltage value of the reference low voltage (Vss)), an external voltage is applied to the anode of the first diode 55 of the first driving module 5 so as to give a forward bias to the first diode 55, and thus the first diode 55 is in a conductive state. At the same time, a reverse bias is given to the diode 65 of the second driving module 6, and thus the diode 65 is in a reverse state. Because the anode of the diode of the unidirectional module 7 is electrically connected to the anode of the diode 65 in the second driving module 6, a reverse bias is given to the diode 71, and thus the diode 71 is in a reverse state. Consequently, the first processed signal (Vgs1) outputted by the first driving module 5 has a voltage value equal to the sum of the first variable voltage (Vset1) outputted by the adjustable power source 56 of the first driving module 5 and a value of the forward voltage drop of the first diode 55 of the first driving module 5, and the second processed signal (Vgs2) outputted by the second driving module 6 has a voltage value of zero; that is to say, the gate-driving signal (Vgs) consisting of the first and second processed signals (Vgs1, Vgs2) has a voltage value equal to the voltage value of the first processed signal (Vgs1). In this embodiment, the first diode 55 is implemented by a Schottky diode, which has the forward voltage drop approximating to 0.3 volts; that is to say, the voltage value of the gate-driving signal (Vgs) is equal to the first variable voltage (Vset1) plus about 0.3 V. At the same time, for the first driving module 5, electric currents flowing from the first diode 55 and the adjustable power source 56 will flow via the current bypass resistor 58 to the low-potential terminal 22 of the gate-driving device. It is worth to note that since the logic-low second driving signal (Vout2) causes the diode 65 of the second driving module 6 to not conduct, a voltage value at the module output terminal 62 of the second driving module 6 (i.e., a voltage value at the anode of the diode 71) is lower than the voltage value (Vset1+0.3 V) at the device output terminal 25, and accordingly the diode 71 is not turned on, so the first processed signal (Vgs1) at the device output terminal 25 is blocked by the diode 71 from flowing into the second driving module 6.

On the other hand, in a scenario where the first driving signal (Vout1) is logic low (i.e., having a voltage value of the reference low voltage (Vss)) and the second driving signal (Vout2) is logic high (i.e., having a voltage value of the reference high voltage (Vcc)), a reverse bias is given to the first diode 55 of the first driving module 5, and thus the first diode 55 is in a reverse state. At the same time, an external voltage is applied to the anode of the diode 65 of the second driving module 6 so as to give a forward bias to the diode 65, and thus the diode 65 is in a conductive state. In addition, an external voltage is also applied to the anode of the diode 71 of the unidirectional module 7 so as to give a forward bias to the diode 71, so the diode 71 is in a conductive state. Moreover, voltage across the second diode 57 of the first driving module 5 is lower than the threshold voltage thereof, so the second diode 57 is in a reverse state. Consequently, the first processed signal (Vgs1) outputted by the first driving module 5 has a voltage value of zero, and the second processed signal (Vgs2) outputted by the second driving module 6 has a voltage value equal to the sum of the second variable voltage (Vset2) outputted by the adjustable power source 66 of the second driving module 6 and a value of the forward voltage drop of the diode 65 of the second driving module 6 minus a value of the forward voltage drop of the diode 71 in the unidirectional module 7; that is to say, the gate-driving signal (Vgs) consisting of the first and second processed signals (Vgs1, Vgs2) has a voltage value equal to the voltage value of the second processed signal (Vgs2). Since the first diode 65 and the diode 71 are both implemented by Schottky diodes and are arranged to be opposite to each other in the direction of current, the voltage across the first diode 65 and the voltage across the diode 71 offset each other. As a result, the gate-driving voltage (Vgs) has a voltage value equal to the second variable voltage (Vset2) outputted by the adjustable power source 66 of the second driving module 6. At the same time, for the second driving module 6, electric currents flowing from the first diode 65 and the adjustable power source 66 will flow via the current bypass resistor 67 to the low-potential terminal 22 of the gate-driving device.

In a scenario where the first driving signal (Vout1) and the second driving signal (Vout2) are both logic low, a reverse bias is given to the first diode 55 in the first driving module 5, and a reverse bias is given to the diode 65 in the second driving module 6. Thus, each of the first diode 55 in the first driving module 5 and the diode 65 in the second driving module 6 is in the reverse state. In addition, when the first driving signal (Vout1) switches from the logic high to the logic low, the input capacitor 53 of the first driving module 5 pulls down voltage at the cathode of the second diode 57 in the first driving module 5 to be lower than the low reference voltage (Vss), so the second diode 57 is in a conductive state. Consequently, the first processed signal (Vgs1) is clamped by the second diode 57 of the first driving module 5 to have a voltage value equal to a difference of the low reference voltage (Vss) and a value of the forward voltage drop (e.g., 0.3 volts for a Schottky diode) of the second diode 57 (Vss−0.3V). From another aspect, voltage at the anode of the diode 71 is equal to the low reference voltage (Vss), and voltage at the cathode of the diode 71 is equal to voltage at the device output terminal 25 that has been pulled down by the input capacitor 53 of the first driving module 5 to be lower than the low reference voltage (Vss), so a forward bias is given to the diode 71 and thus the diode 71 is in the conductive state. Hence, the gate-driving voltage (Vgs) can also be calculated by subtracting the value of the forward voltage drop (e.g., 0.3 volts for a Schottky diode) of the diode 71 from the low reference voltage (Vss).

In summary, the gate-driving circuit 4 for outputting the gate-driving signal (Vgs) to a gate of a DUT according to the disclosure utilizes the first driving module 5 to generate the first processed signal (Vgs1) based on the first driving signal (Vout1) received by the first driving module 5, utilizes a combination of the second driving module 6 and the unidirectional module 7 to generate the second processed signal (Vgs2) based on the second driving signal (Vout2) received by the second driving module 6, and outputs the gate-driving signal (Vgs) by combining the first and second processed signals (Vgs1, Vgs2) thus generated. In addition, magnitude of the first processed signal (Vgs1) can be adjusted by adjusting the first variable voltage (Vset1) outputted by the adjustable power source 56 of the first driving module 5, and also magnitude of the second processed signal (Vgs2) can be adjusted by adjusting the second variable voltage (Vset2) outputted by the adjustable power source 66 of the second driving module 6. In this way, peak values of pluses in the gate-driving signal (Vgs), which are related to the first control signal (Vin1) and the second control signal (Vin2), can be varied to test the DUT in a dynamic condition, i.e., to switch the DUT between a conductive state and a reverse state.

As shown in FIG. 2, the first control signal (Vin1) and the second control signal (Vin2) cooperatively constitute the waveform of the complete pulse signal, and each of the first control signal (Vin1) and the second control signal (Vin2) contains a part of the pluses of the pulse signal, and the pulses of the first control signal (Vin1) do not overlap the pulses of the second control signal (Vin2). By means of merely changing magnitude of pulses of the second control signal (Vin2), magnitude of one part of pulses in the gate-driving signal (Vgs) that corresponds to the pulses of the second control signal (Vin2) is changed while magnitude of the other part of the pulses in the gate-driving signal (Vas) that corresponds to the pulses of the first control signal (Vin1) is kept unchanged. In this way, the gate-driving circuit 4 or the gate-driving device according to the disclosure is capable of generating the gate-driving signal (Vgs) that is adjustable for testing a device made of third-generation semiconductor materials in a real system or in a characterization test circuit.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure. While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A gate-driving circuit for outputting a gate-driving signal to a gate of a device under test (DUT), said gate-driving circuit having a first circuit input terminal via which a first driving signal is received, a second circuit input terminal via which a second driving signal is received, a low-potential terminal, and a circuit output terminal via which the gate-driving signal is outputted, said gate-driving circuit comprising:

a first driving module having a module input terminal that is electrically connected to said first circuit input terminal of said gate-driving circuit, and a module output terminal that is electrically connected to said circuit output terminal of said gate-driving circuit, said first driving module including an input capacitor and an input resistor that are connected in parallel and that are electrically connected between said module input terminal and said module output terminal of said first driving module,
an adjustable power source that is electrically connected between said module output terminal of said first driving module and said low-potential terminal of said gate-driving circuit, and
a first diode that is electrically connected between said module output terminal of said first driving module and said adjustable power source of said first driving module;
a second driving module having a module input terminal that is electrically connected to said second circuit input terminal of said gate-driving circuit, and a module output terminal that is electrically connected to said circuit output terminal of said gate-driving circuit, said second driving module including
an input capacitor and an input resistor that are connected in parallel and that are electrically connected between said module input terminal and said module output terminal of said second driving module,
an adjustable power source that is electrically connected between said module output terminal of said second driving module and said low-potential terminal of said gate-driving circuit, and
a diode that is electrically connected between said module output terminal of said second driving module and said adjustable power source of said second driving module; and
a unidirectional module electrically connected between said module output terminal of said second driving module and said circuit output terminal of said gate-driving circuit, and configured to allow an electrical signal to pass only from said second driving module to said circuit output terminal of said gate-driving circuit.

2. The gate-driving circuit as claimed in claim 1, wherein said first driving module further includes a second diode having an anode that is electrically connected to said low-potential terminal of said gate-driving circuit, and a cathode that is electrically connected to said module output terminal of said first driving module.

3. The gate-driving circuit as claimed in claim 1, wherein said unidirectional module includes a diode having an anode that is electrically connected to said module output terminal of said second driving module, and a cathode that is electrically connected to said circuit output terminal of said gate-driving circuit.

4. The gate-driving circuit as claimed in claim 3, wherein said unidirectional module further includes:
a capacitor that is connected to said diode of said unidirectional module in parallel;
a variable resistor that is connected between said cathode of said diode of said unidirectional module and said circuit output terminal of said gate-driving circuit; and
a resistor that is connected between said anode of said diode of said unidirectional module and said circuit output terminal of said gate-driving circuit.

5. The gate-driving circuit as claimed in claim 1, wherein:
said adjustable power source of said first driving module has a positive electrode, and a negative electrode that is electrically connected to said low-potential terminal of said gate-driving circuit;
said adjustable power source of said second driving module has a positive electrode, and a negative electrode that is electrically connected to said low-potential terminal of said gate-driving circuit;

said first diode of said first driving module has an anode that is electrically connected to said module output terminal of said first driving module, and a cathode that is electrically connected to said positive electrode of said adjustable power source of said first driving module; and
said diode of said second driving module has an anode that is electrically connected to said module output terminal of said second driving module, and a cathode that is electrically connected to said positive electrode of said adjustable power source of said second driving module.

6. The gate-driving circuit as claimed in claim 5, wherein:
said first driving module further includes a current bypass resistor that has two ends electrically connected to said positive electrode and said negative electrode of said adjustable power source of said first driving module, respectively; and
said second driving module further includes a current bypass resistor that has two ends electrically connected to said positive electrode and said negative electrode of said adjustable power source of said second driving module, respectively.

7. The gate-driving circuit as claimed in claim 5, wherein:
said first driving module further includes a voltage-stabilizing capacitor that has two ends electrically connected to said positive electrode and said negative electrode of said adjustable power source of said first driving module, respectively; and
said second driving module further includes a voltage-stabilizing capacitor that has two ends electrically connected to said positive electrode and said negative electrode of said adjustable power source of said second driving module, respectively.

8. A gate-driving device for outputting a gate-driving signal to a gate of a device under test (DUT), having a first device input terminal via which a first control signal is received, a second device input terminal via which a second control signal is received, a high-potential terminal, a low-potential terminal, and a device output terminal via which the gate-driving signal is outputted, said gate-driving device comprising:
a first driver electrically connected to said first device input terminal, said high-potential terminal and said low-potential terminal of said gate-driving device, said first driver being configured to receive the first control signal from said first device input terminal, and to output a first driving signal based on the first control signal;
a second driver electrically connected to said second device input terminal, said high-potential terminal and said low-potential terminal of said gate-driving device, said second driver being configured to receive the second control signal from said second device input terminal, and to output a second driving signal based on the second control signal; and
a gate-driving circuit having a first circuit input terminal via which the first driving signal is received, a second circuit input terminal via which the second driving signal is received, a low-potential terminal that is electrically connected to said low-potential terminal of said gate-driving device, and a circuit output terminal that is electrically connected to said device output terminal of said gate-driving device, said gate-driving circuit including
a first driving module having a module input terminal that is electrically connected to said first circuit input terminal of said gate-driving circuit, and a module output terminal that is electrically connected to said circuit output terminal of said gate-driving circuit, said first driving module including
an input capacitor and an input resistor that are connected in parallel and that are electrically connected between said module input terminal and said module output terminal of said first driving module,
an adjustable power source that is electrically connected between said module output terminal of said first driving module and said low-potential terminal of said gate-driving circuit, and
a first diode that is electrically connected between said module output terminal of said first driving module and said adjustable power source of said first driving module,
a second driving module having a module input terminal that is electrically connected to said second circuit input terminal of said gate-driving circuit, and a module output terminal that is electrically connected to said circuit output terminal of said gate-driving circuit, said second driving module including
an input capacitor and an input resistor that are connected in parallel and that are electrically connected between said module input terminal and said module output terminal of said second driving module,
an adjustable power source that is electrically connected between said module output terminal of said second driving module and said low-potential terminal of said gate-driving circuit, and
a diode that is electrically connected between said module output terminal of said second driving module and said adjustable power source of said second driving module, and
a unidirectional module electrically connected between said module output terminal of said second driving module and said circuit output terminal of said gate-driving circuit, and configured to allow an electrical signal to pass only from said second driving module to said circuit output terminal of said gate-driving circuit.

9. The gate-driving device as claimed in claim 8, further comprising a slew-rate-adjusting resistor having one end that is electrically connected to said device output terminal of said gate-driving device, and the other end that is configured to be electrically connected to the gate of the DUT.

10. The gate-driving device as claimed in claim 8, wherein said first driving module further includes a second diode having an anode that is electrically connected to said low-potential terminal of said gate-driving circuit, and a cathode that is electrically connected to said module output terminal of said first driving module.

11. The gate-driving device as claimed in claim 8, wherein said unidirectional module includes a diode having an anode that is electrically connected to said module output terminal of said second driving module, and a cathode that is electrically connected to said circuit output terminal of said gate-driving circuit.

12. The gate-driving device as claimed in claim 11, wherein said unidirectional module further includes:
a capacitor that is connected to said diode of said unidirectional module in parallel;
a variable resistor that is connected between said cathode of said diode of said unidirectional module and said circuit output terminal of said gate-driving circuit; and
a resistor that is connected between said anode of said diode of said unidirectional module and said circuit output terminal of said gate-driving circuit.

13. The gate-driving device as claimed in claim 8, wherein:
said adjustable power source of said first driving module has a positive electrode, and a negative electrode that is electrically connected to said low-potential terminal of said gate-driving circuit;
said adjustable power source of said second driving module has a positive electrode, and a negative electrode that is electrically connected to said low-potential terminal of said gate-driving circuit;
said first diode of said first driving module has an anode that is electrically connected to said module output terminal of said first driving module, and a cathode that is electrically connected to said positive electrode of said adjustable power source of said first driving module; and
said diode of said second driving module has an anode that is electrically connected to said module output terminal of said second driving module, and a cathode that is electrically connected to said positive electrode of said adjustable power source of said second driving module.

14. The gate-driving device as claimed in claim 13, wherein:
said first driving module further includes a current bypass resistor that has two ends electrically connected to said positive electrode and said negative electrode of said adjustable power source of said first driving module, respectively; and
said second driving module further includes a current bypass resistor that has two ends electrically connected to said positive electrode and said negative electrode of said adjustable power source of said second driving module, respectively.

15. The gate-driving device as claimed in claim 13, wherein:
said first driving module further includes a voltage-stabilizing capacitor that has two ends electrically connected to said positive electrode and said negative electrode of said adjustable power source of said first driving module, respectively; and
said second driving module further includes a voltage-stabilizing capacitor that has two ends electrically connected to said positive electrode and said negative electrode of said adjustable power source of said second driving module, respectively.

* * * * *